United States Patent
Chou et al.

(10) Patent No.: US 10,526,534 B2
(45) Date of Patent: Jan. 7, 2020

(54) COMPOSITE MATERIAL, METHOD OF MANUFACTURING THE SAME, AND APPLICATION THE SAME

(71) Applicant: Unique Materials Co., Ltd., Taipei (TW)

(72) Inventors: Pi-Tai Chou, Taipei (TW); Chia-Chun Hsieh, Taipei (TW)

(73) Assignee: Unique Materials Co., Ltd., Taipei (TW)

(*) Notice: Subject to any disclaimer, the term of this patent is extended or adjusted under 35 U.S.C. 154(b) by 275 days.

(21) Appl. No.: 15/395,386

(22) Filed: Dec. 30, 2016

(65) Prior Publication Data

US 2018/0187070 A1    Jul. 5, 2018

(51) Int. Cl.
| | | |
|---|---|---|
| C09K 11/02 | (2006.01) | |
| C09K 11/88 | (2006.01) | |
| G02B 26/00 | (2006.01) | |
| C08K 9/02 | (2006.01) | |
| C08K 3/30 | (2006.01) | |
| H01L 33/50 | (2010.01) | |
| B82Y 40/00 | (2011.01) | |
| B82Y 20/00 | (2011.01) | |
| B82Y 30/00 | (2011.01) | |
| C08K 3/08 | (2006.01) | |
| C08K 3/32 | (2006.01) | |

(52) U.S. Cl.
CPC ............. *C09K 11/025* (2013.01); *C08K 9/02* (2013.01); *C09K 11/883* (2013.01); *G02B 26/008* (2013.01); *B82Y 20/00* (2013.01); *B82Y 30/00* (2013.01); *B82Y 40/00* (2013.01); *C08K 3/08* (2013.01); *C08K 3/30* (2013.01); *C08K 3/32* (2013.01); *C08K 2003/3027* (2013.01); *C08K 2003/3036* (2013.01); *H01L 33/502* (2013.01); *Y10S 977/774* (2013.01); *Y10S 977/892* (2013.01); *Y10S 977/95* (2013.01)

(58) Field of Classification Search
CPC ..... C09K 11/025; G02B 26/008; H01L 33/56; H01L 33/502; B92Y 20/00
See application file for complete search history.

(56) References Cited

U.S. PATENT DOCUMENTS

| | | | |
|---|---|---|---|
| 9,139,770 B2 * | 9/2015 | Freeman | C08G 77/38 |
| 9,193,833 B2 * | 11/2015 | Goto | C08G 77/395 |
| 2014/0369024 A1 * | 12/2014 | Xu | C08F 2/44 |
| | | | 362/84 |
| 2016/0017099 A1 * | 1/2016 | Furuta | C08G 77/392 |
| | | | 252/301.36 |

* cited by examiner

*Primary Examiner* — C Melissa Koslow
(74) *Attorney, Agent, or Firm* — J.C. Patents

(57) ABSTRACT

The composite material of the invention includes a plurality of quantum dots and a matrix. The matrix is formed by a plurality of siloxane compounds crosslinked with a component which comprises a plurality of oxime-based silicone primer compounds. The quantum dots are chemically bonded to the matrix through a plurality of amino groups. The quantum dots are uniformly dispersed in the matrix of the composite material.

16 Claims, 4 Drawing Sheets

COMPOSITE MATERIAL, METHOD OF MANUFACTURING THE SAME, AND APPLICATION THE SAME

BACKGROUND OF THE INVENTION

1. Field of the Invention

The present invention generally relates to a material, a method of manufacturing the same and an application the same, in particular, to a composite material, a method of manufacturing the same, a light emitting diode (LED) device and a projector color wheel using the composite material.

2. Description of Related Art

During the process of manufacturing the LED devices, one step is to package LED chips in an optically transparent packaging material (e.g., silicone, epoxy etc.) to protect the LED chips. In addition, luminescent materials can be distributed throughout the packaging material, which can convert the light emitted from the LED chips (e.g., blue light) to another color (e.g., white light).

In general, the luminescent materials include phosphors, quantum dots (QDs) and the like. The QDs are semiconductor materials with a nano-sized (generally <100 nm) dimensions and a crystalline structure. Due to the small size of the QDs, they have unique physicochemical characteristics that differ from the inherent characteristics of corresponding bulk semiconductor materials. Compared with the conventional phosphors, the QDs are able to generate monochromatic light of different colors depending on the particle size or composition, which is not achievable by the conventional phosphors.

Currently, when using QDs in the packaging material of LED devices, QDs are first dispersed in a solvent and then mixed with the packaging material. This is due to the QDs cannot be dispersed uniformly in the packing material without the solvent. When solvent is removed, QDs tend to aggregate which causes the QDs to lose their good luminescence properties. Moreover, using solvents will produce more pollutants, and will cause problems such as generating bubbles inside the material during curing and loss of thickness/volume after curing. As a result, the conventional method will lead to an increase in manufacturing cost and time (e.g., waiting for the solvent to evaporate), and will lower the productivity of the manufacturing process.

The same problems are also encountered in the manufacture of DLP projector color wheels using solvents to disperse QDs and mixing with packaging material.

SUMMARY OF THE INVENTION

The invention provides a composite material, a method of manufacturing the same, a light emitting diode (LED) device and a projector color wheel using the composite material. The method is capable of manufacturing the composite material, which the QDs is dispersed uniformly in the mixture (e.g., packaging material) without a solvent.

The composite material of the invention includes a plurality of quantum dots and a matrix. The matrix is formed by a plurality of siloxane compounds crosslinked with a component which comprises a plurality of oxime-based silicone primer compounds. The quantum dots are chemically bonded to the matrix through a plurality of amino groups. The quantum dots are uniformly dispersed in the matrix of the composite material.

In an embodiment of the invention, one portion of a surface of one of the quantum dots is covered by the matrix with the amino groups.

In an embodiment of the invention, another portion of the surface of one of the quantum dots is surrounded by the matrix without the amino groups.

In an embodiment of the invention, the quantum dots comprise core structure, core-shell structure, core-multishell structure, core-alloy layer-shell structure, core-alloy layer-multishell structure, core-gradient alloy-shell structure, or a combination thereof.

In an embodiment of the invention, each of the quantum dots includes a core structure and a shell structure covering the core structure. The core structure is selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe, and alloys thereof. The shell structure is selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe, and alloys thereof.

In an embodiment of the invention, the quantum dots are perovskite quantum dots.

In an embodiment of the invention, the siloxane compounds are represented by formula I:

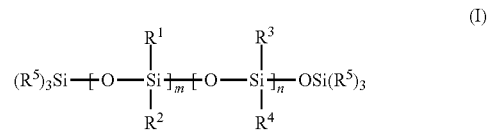

wherein each $R^1$, $R^2$, $R^3$, $R^4$ and $R^5$ is independently selected from the group consisting of $C_{1-8}$ alkyl, cycloalkyl, aryl, alkoxy and $C_{2-8}$ alkylamine, and at least one of $R^1$-$R^5$ is $C_{2-8}$ alkylamine;
m is an integer from 1 to 500; and
n is an integer from 0 to 500.

The light emitting diode (LED) device of the invention includes a LED chip and the foregoing composite material. The composite material is disposed onto the LED chip.

The projector color wheel of the invention includes a plurality of color-conversion sections and the foregoing composite material. The composite material is disposed onto at least one of the color-conversion sections.

In an embodiment of the invention, a method of manufacturing a composite material includes the following steps. A plurality of quantum dots and a plurality of siloxane compounds are mixed to form a first mixture. Each of the siloxane compounds has a plurality of amino groups. The siloxane compounds are chemically bonded to at least one of the quantum dots through the amino groups. A second component comprising a plurality of oxime-based silicone primer compounds is added to the first mixture, and a curing step is then performed, so as to form a matrix of the composite material. The quantum dots are uniformly dispersed in the matrix of the composite material.

In an embodiment of the invention, a process of the oxime-based silicone primer compounds respectively crosslinked with the siloxane compounds during the curing step includes a moisture activation step followed by a condensation reaction.

In an embodiment of the invention, the first mixture and the second component are substantially solvent-free, and no solvent removal step is required.

In an embodiment of the invention, the first mixture and the second component are substantially Pt catalyst-free or Rh catalyst-free.

In an embodiment of the invention, a content of the quantum dots is 0.1-20 wt % and a content of the siloxane compounds is 80-99.9 wt % based on the total weight of the first mixture.

In an embodiment of the invention, a content of the second component is equal to or more than a content of the first mixture.

In an embodiment of the invention, a weight ratio of the first mixture to the second component ranges from 1:9 to 1:1.

Based on the above, the invention provides a composite material, a method of manufacturing the same, a light emitting diode (LED) device and a projector color wheel, using the composite material. In the method, the siloxane compounds are chemically bonded to at least one of the quantum dots through the amino groups, thus the quantum dots are easy to disperse in the matrix of the composite material without a solvent. Namely, no solvent removal step is required, which decreases the manufacturing cost, time, waste, and pollution while improving productivity.

The quantum dots are uniformly dispersed in the matrix of the composite material (e.g., packaging material) through the siloxane compounds. As a result, the luminescence efficacy of the composite material is improved which is suitable for surface package of photoelectric devices, such as LED devices or projector color wheels.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
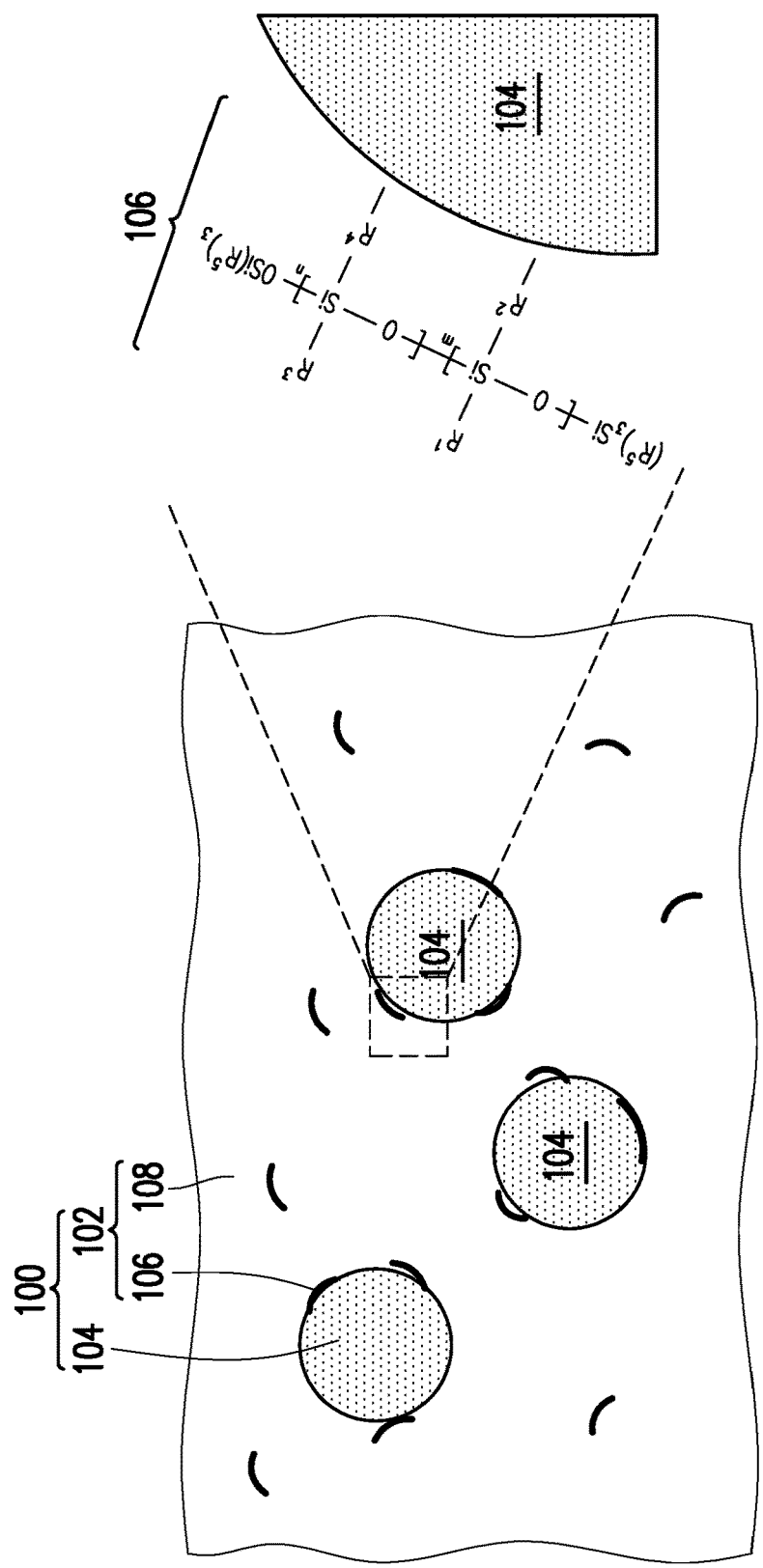
FIG. 1 is a schematic drawing illustrating a composite material according to a first embodiment of the invention.

Hereinafter, the invention is illustrated more comprehensively referring to the drawings. However, the invention may be embodied in many different forms and should not be construed as limited to the embodiments set forth herein. Thicknesses of layers and regions in the drawings may be enlarged for clarity. The same or similar reference numbers represent the same or similar components, and are not repeated again in the following paragraphs.

In the present specification, ranges represented by "a numerical value to another numerical value" are schematic representations to avoid listing all of the numerical values in the range in the specification. Therefore, the recitation of a specific numerical range discloses any numerical value in the numerical range and a smaller numerical range defined by any numerical value in the numerical range, as is the case with any numerical value and a smaller numerical range stated expressly in the specification. For instance, the range of "a size of 100 nm to 500 nm" discloses the range of "a size of 200 nm to 350 nm", regardless of whether other numerical values are listed in the specification.

FIG. 1 is a schematic drawing illustrating a composite material according to a first embodiment of the invention.

Referring to FIG. 1, a composite material 100 includes a matrix 102 and a plurality of quantum dots 104. Specifically, the matrix 102 is formed by a plurality of siloxane compounds 106 crosslinked with a second component 108. The quantum dots 104 are chemically bonded to the matrix 102 through a plurality of amino groups of the siloxane compounds 106.

As shown in the enlarged view of FIG. 1, each of the siloxane compounds 106 has a plurality of amino groups. The siloxane compounds 106 are chemically bonded to at least one of the quantum dots 104 through the amino groups, such that one portion of a surface of one of quantum dots 104 is covered by one portion of the siloxane compounds 106 (or the matrix 102 with the amino groups). In one example, the siloxane compounds 106 may be any siloxane compound including the amino groups. More specifically, an example includes amodimethicone, other derivatives of amodimethicone, such as copolymers of amodimethicone, and aminopropyl dimethicone. As shown in FIG. 1, the siloxane compounds 106 that interacts with the quantum dots includes $R^2$, $R^3$, $R^4$ and $R^5$, wherein each $R^2$, $R^3$, $R^4$ and $R^5$ is independently selected from the group consisting of $C_{1-8}$ alkyl, cycloalkyl, aryl, alkoxy and $C_{2-8}$ alkylamine. In the embodiment, at least one of $R^2$ and $R^4$ includes the amino groups, such as $C_{2-8}$ alkylamine, to be chemically bonded to the portion of one of quantum dots 104. In addition, the formula of the siloxane compounds 106 will be described in detail later in the specification and therefore not described here.

In some embodiments, the quantum dots 104 refer to nanostructures that are substantially monocrystalline. However, the invention is not limited thereto. In other embodiment, the quantum dots 104 refer to nanostructures that are polycrystalline or amorphous. A dimension of each of the quantum dots 104 may be less than about 500 nm, and down to on the order of less than about 1 nm. As used herein, when referring to any numerical value, "about" means a value of +10% of the stated value (e.g. about 100 nm encompasses a range of sizes from 90 nm to 110 nm, inclusive).

In some embodiments, the quantum dots 104 may be core structure, core-shell structure, core-multishell structure, core-alloy layer-shell structure, core-alloy layer-multishell structure, core-gradient alloy-shell structure, or a combination thereof. When the quantum dots 104 are core-shell structure, each of the quantum dots 104 includes a core structure and a shell structure covering the core structure. The core structure may be selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe, and alloys thereof. The shell structure may be selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe, and alloys thereof. However, the invention is not limited thereto. In other embodiment, the quantum dots 104 may be perovskite.

On the other hand, the siloxane compounds 106 refers to a compound having a monomer repeat unit of the formula: —Si(R$_2$)O—. The siloxane compounds may be linear, branched or cyclic. The R groups of each of the siloxane compounds 106 may be any suitable group, which may be the same or different, including, but not limited to, hydrogen, alkyl, heteroalkyl, carboxyalkyl, alkylamine, alkenyl, alkynyl, cycloalkyl, heterocycloalkyl, aryl, alkoxy and heteroaryl. The siloxane compounds 106 may be a homopolymer, which includes a single type of monomer repeat unit. Alternatively, the siloxane compounds 106 may be a copolymer that is a random copolymer or a block copolymer, which includes two or more types of monomer repeat units.

In some embodiments, the siloxane compounds 106 may be represented by formula I:

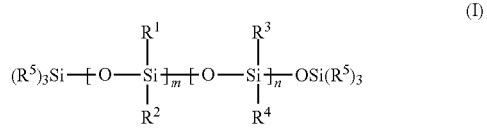

(I)

wherein each $R^1$, $R^2$, $R^3$, $R^4$ and $R^5$ is independently selected from the group consisting of $C_{1-8}$ alkyl, cycloalkyl, aryl, alkoxy and $C_{2-8}$ alkylamine, and at least one of $R^1$-$R^5$ is $C_{2-8}$ alkylamine;

m is an integer from 1 to 500; and n is an integer from 0 to 500.

The foregoing "alkyl" refers to a straight or branched, saturated, aliphatic radical having the number of carbon atoms indicated. For example, $C_{1-6}$ alkyl includes, but is not limited to, methyl, ethyl, propyl, isopropyl, butyl, isobutyl, sec-butyl, tert-butyl, pentyl, isopentyl, hexyl, etc. Alkyl groups can be substituted or unsubstituted.

The foregoing "cycloalkyl" refers to a saturated or partially unsaturated, monocyclic, fused bicyclic or bridged polycyclic ring assembly containing from 3 to 12 ring atoms, or the number of atoms indicated. Cycloalkyl may include any number of carbons, such as $C_{3-6}$, $C_{4-6}$, $C_{5-6}$, $C_{3-8}$, $C_{4-8}$, $C_{5-8}$, $C_{6-8}$, $C_{3-9}$, $C_{3-10}$, $C_{3-11}$, $C_{3-12}$, $C_{6-10}$, or $C_{6-12}$. Cycloalkyl groups may be saturated or partially unsaturated. Cycloalkyl groups may be substituted or unsubstituted.

The foregoing "aryl" refers to an aromatic ring system having any suitable number of ring atoms and any suitable number of rings. Aryl groups may include any suitable number of ring atoms, such as, 6, 7, 8, 9, 10, 11, 12, 13, 14, 15 or 16 ring atoms, as well as from 6 to 10, 6 to 12, or 6 to 14 ring members. Aryl groups may be monocyclic, fused to form bicyclic or tricyclic groups, or linked by a bond to form a biaryl group. Aryl groups may be substituted or unsubstituted.

The foregoing "alkoxy" refers to an alkyl group attached to an oxygen via a single bond. For example, $C_{1-6}$ alkoxy includes, but is not limited to, methoxy, ethoxy, propoxy, isopropoxy, butoxy, isobutoxy, sec-butoxy, tert-butoxy, pentoxy, hexoxy, phenoxy, etc. Alkoxy groups can be substituted or unsubstituted.

The foregoing "alkylamine" refers to an amine linked to an alkyl, as described above, and generally having the formula —$C_{1-8}$ alkyl-NR$_2$. The alkyl moiety of the alkylamine group is linked to the siloxane polymer of the present invention. Any suitable alkyl chain is useful. The R groups attached to the nitrogen atom can be any suitable group, including hydrogen and alkyl. Moreover, the R groups can be the same or different. Alkylamine can also include long-chain alkyl groups where the alkyl group can be $C_{8-20}$.

In some embodiments, the siloxane compounds 106 may be one kind of amodimethicone, derivatives of amodimethicone, such as copolymers of amodimethicone, aminopropyl dimethicone and more generally siloxane compounds including the amino functional groups. One embodiment of amodimethicone is aminoethyl aminopropyl methyl, dimethyl siloxane which is represented by formula II:

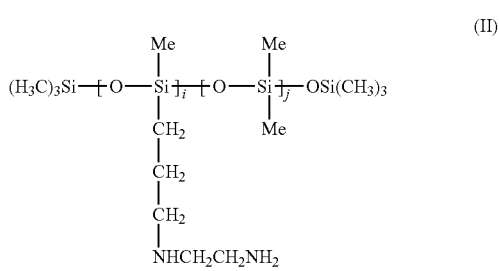

(II)

wherein i is an integer from 1 to 50;

and j is an integer from 1 to 500.

In some embodiments, a viscosity of the siloxane compounds 106 ranges from 100 to 7000 cP. The siloxane compounds 106 may have a molecular weight of from 2 kDa to 50 kDa. However, the invention is not limited thereto. In other embodiment, the viscosity and the molecular weight of the siloxane compounds 106 may be adjusted according to the needs.

Referring back to FIG. 1, the second component 108 at least includes a plurality of oxime-based silicone primer compounds. The oxime-based silicone primer compounds are respectively crosslinked with the siloxane compounds 106 so as to solidify the composite material 100 and form the matrix 102 of the composite material 100. Thus, the quantum dots 104 are able to disperse homogeneously within the matrix 102 (which includes the siloxane compounds 106 and the second component 108) of the composite material 100. In addition, another portion of the surface of the quantum dots 104 is surrounded by the matrix 102 without the amino groups, as shown in FIG. 1. That is, the quantum dots 104 and the siloxane compounds 106 are homogeneously dispersed in the second component 108.

It should be noticed that the quantum dots 104 are uniformly dispersed in the matrix 102 through the siloxane compounds 106 with amino groups. Since the quantum dots 104 are uniformly dispersed without aggregation, the luminescence efficacy of the composite material 100 is improved which is suitable for surface package of photoelectric devices, such as LED devices, and projector color wheels. In general, the amino groups are incompatible with metal-catalyzed cure silicone. Hence, the siloxane compounds 106 and the second component 108 are substantially Pt catalyst-free or Rh catalyst-free.

In some embodiments, one example of oxime-based silicone primer compounds is 2-Butanone, O,O,O"-(methylsilylidyne)trioxime which is represented by formula III:

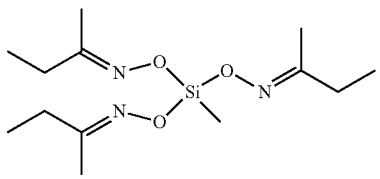
(III)

In some embodiments, the second component 108 is commercially available from material suppliers. The second component 108 is optically clear or preferably colorless. In an embodiment, the second component 108 is flowable, and a viscosity of the second component 108 is less than 10000 cP. In an alternative embodiment, the viscosity of the second component 108 is between 2000 cP and 8000 cP.

In summary, the present embodiment provides a composite material, a method of manufacturing the same, a light emitting diode (LED) device and a projector color wheel using the composite material. In the method, the siloxane compounds are chemically bonded to at least one of the quantum dots through the amino groups, thus the quantum dots can be dispersed in the matrix of the composite material without a solvent. Namely, no solvent removal step is required, which decreases the manufacturing cost, time, waste, and pollution while improving the productivity.

In addition, the quantum dots are uniformly dispersed in the matrix of the composite material (e.g., packaging material) through the siloxane compounds without aggregation. As a result, the luminescence efficacy of the composite material is improved, which is suitable for surface package of photoelectric devices, such as LED devices, and projector color wheels.

Figure 2:
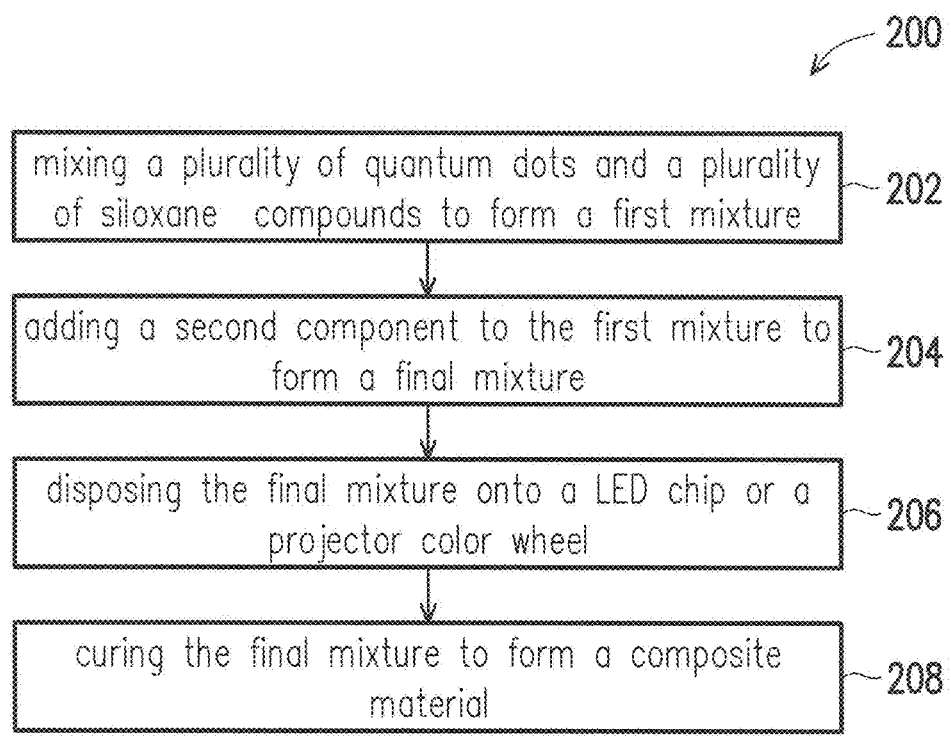
FIG. 2 is a flow-chat drawing illustrating a manufacturing flow of a device using a composite material according to a second embodiment of the invention.

FIG. 2 is a flow-chat drawing illustrating a manufacturing flow of a device using a composite material according to a second embodiment of the invention.

Referring to FIG. 2, a method 200 for manufacturing the composite material of the second embodiment is as follows. First, a step 202 is performed. A plurality of quantum dots and a plurality of siloxane compounds are mixed to form a first mixture. The first mixture is stirred or sonicated at room temperature (e.g., 25° C.) to fully disperse the quantum dots. More specifically, each of the siloxane compounds has a plurality of amino groups. During the stirring or sonicating, the siloxane compounds are chemically bonded to at least one of the quantum dots through the amino groups such that the quantum dots are separated from each other without aggregation.

In some embodiments, a content of the quantum dots is 0.1-20 wt % and a content of the siloxane compounds is 80-99.9 wt % based on the weight of the first mixture (i.e., a sum of the quantum dots and the siloxane compounds).

Next, a step 204 is performed. A second component is added to the first mixture to form a final mixture. The second component includes a plurality of oxime-based silicone primer compounds. In some embodiments, a content of the second component is equal to or more than a content of the first mixture. In present embodiment, a weight ratio of the first mixture to the second component ranges from 1:9 to 1:1. However, the invention is not limited thereto. In other embodiment, the weight ratio of the first mixture to the second component may be adjusted according to the needs. In alternative embodiments, the first mixture and the second component are substantially Pt catalyst-free or Rh catalyst-free.

After mixing, a step 206 is performed. In an embodiment, the final mixture formed is disposed onto a LED chip. More specifically, the LED chip is one component of a LED device. The LED device may include a substrate with a cavity and the LED chip disposed in the cavity of the substrate. In other embodiment, the LED device may be produced using chip scale packaging process. The LED device may be any suitable LED package type, including, but not limited to, flip chip-LED, side-LED, surface mount LED and chip-on-board LED. The final mixture formed from foregoing step 204 is dispensed onto the LED chip and covers a surface of the LED chip. In another embodiment, the final mixture formed is disposed onto a projector color wheel. More specifically, the projector color wheel is one component of a projector device. The projector device may include a circular rotating color wheel comprising a metal wheel and a plurality of color converters respectively disposed in a plurality of color-conversion sections. The final mixture formed from foregoing step 204 is used as color converters and cover the color-conversion sections of the projector color wheel. The final mixture at least includes one or a plurality of quantum dots. The quantum dots may be red, green or blue emitting or any other colors desired. The quantum dots are able to absorb the light emitted from the LED chip or the light emitted from the projector device light source (e.g. lamp, LED, laser diode) and then re-emit the excited energy as light with a different wavelength. The quantum dots may have variously-regulated light emitting wavelengths. For example, one white LED device may be fabricated by combining red and green quantum dots with a blue LED chip. Alternatively, another white LED device may be fabricated by combining red, green, and blue quantum dots with an ultraviolet (UV) LED chip. Furthermore, another example may be one projector device with a color wheel that uses green and red quantum dots as color converters to convert a blue light source to green and red light respectively. Alternatively, another DLP projector color wheel may be fabricated by combining red, green, and blue quantum dots with an ultraviolet light source. Furthermore, the individual colors produced by the color wheel is not limited to three colors (eg, red, green and blue), and may use any number of different colors depending on the application.

Finally, a step 208 is performed. A curing step is performed on the final mixture to form the matrix 102 of the composite material 100 (as shown in FIG. 1). The curing of the final mixture involves steps of the oxime-based silicone primer compounds respectively crosslinked with the siloxane compounds, which includes a moisture activation and a condensation reaction. During the moisture activation, the siloxane compounds are fully hydrolyzed or partially hydrolyzed by the moisture present in the normal atmosphere, so as to form the siloxane compounds with hydroxyl groups (OH groups) attached on Si of the siloxane compounds. The moisture activation scheme (1) is represented as below.

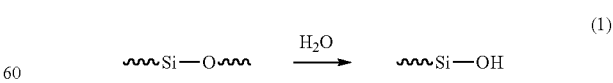

(1)

Then, during the condensation reaction, the oxime-based silicone primer compounds of the second component are crosslinked with the fully hydrolyzed or partially hydrolyzed siloxane compounds to form the composite material and oxime compounds. The condensation reaction scheme (2) is represented as below.

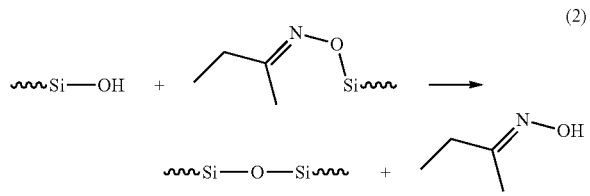

(2)

In order to improve reliability of the invention, the following lists several examples and several comparative examples to illustrate the composite material 100 of the invention further. Although the following experiments are described, the material used and the amount and ratio of each thereof, as well as handling details and handling procedures, etc., can be suitably modified without exceeding the scope of the invention. Accordingly, restrictive interpretation should not be made to the invention based on the embodiments described below.

Example 1

Amodimethicone (available from Dow Corning Corp.) and red CdSe/ZnS quantum dots (which particle size ranges from 1 nm to 20 nm; synthesized according to scientific literatures) are mixed at a weight ratio of 19:1 to form a mixture. Then, the mixture is sonicated at room temperature (e.g., 25° C.) to fully disperse the red quantum dots.

Comparative Example 1

Pt-catalyzed silicone (available from Dow Corning Corp.) is mixed with the same red quantum dots used in example 1 at a weight ratio of 19:1. However, the quantum dots are unable to disperse in the silicone.

Example 2

Amodimethicone (available from Dow Corning Corp.) is mixed with an oxime-based silicone (available from Dow Corning Corp.) at a weight ratio of 3.5:6.5 to form a mixture. Then, the mixture is dispensed onto a glass slide and cured at 70° C. for 3 hours.

Comparative Example 2

Amodimethicone (available from Dow Corning Corp.) is mixed with Pt-catalyzed silicone (available from Dow Corning Corp.) at a weight ratio of 3.5:6.5 to form a mixture. The mixture is unable to cure at 150° C.

Example 3

Amodimethicone (available from Dow Corning Corp.) and green CdSe/ZnS quantum dots (which particle size ranges from 1 nm to 20 nm; synthesized according to scientific literatures) are mixed at a weight ratio of 9:1 to form a mixture. The mixture is sonicated at room temperature (e.g., 25° C.) to fully disperse the green quantum dots. This mixture is then mixed with an oxime-based silicone at a weight ratio of 2.5:7.5 and applied onto a glass slide to form a thin film. The film is cured at 70° C. for 3 hours.

Figure 3:
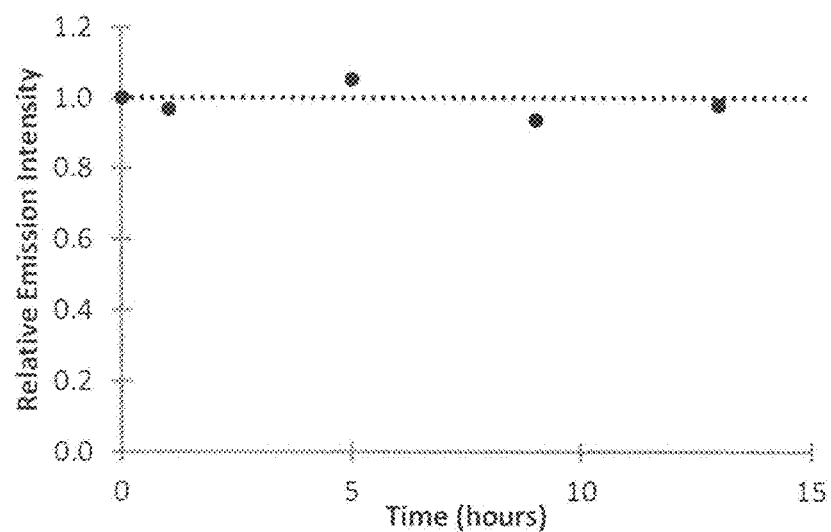
FIG. 3 is a relative emission intensity spectrogram of Example 3 during storage for different times.

It should be noticed that the thin film shows a good stability when stored at 100° C. under normal atmospheric conditions (as shown in FIG. 3), with no observable alterations in the physical appearance. The emission intensity of the green quantum dots stays constant after storing at 100° C. for 13 hours.

Example 4

Figure 4:
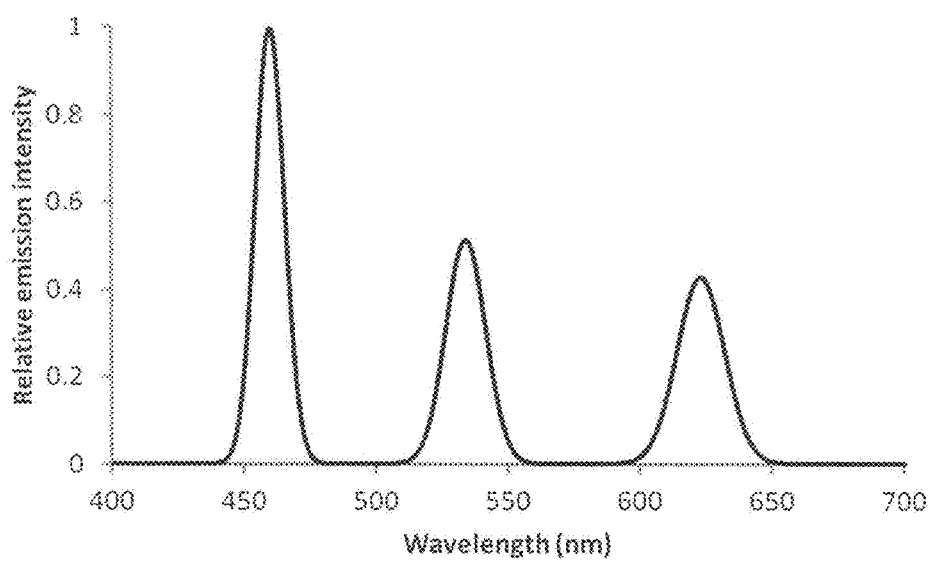
FIG. 4 is a LED output spectrum of Example 4.

90 wt % amodimethicone (available from Dow Corning Corp.), 9.5 wt % green CdSe/ZnS quantum dots (which particle size ranges from 1 nm to 20 nm; synthesized according to scientific literatures) and 0.5 wt % red CdSe/ZnS quantum dots (which particle size ranges from 1 nm to 20 nm; synthesized according to scientific literatures) are sonicated at room temperature (e.g., 25° C.) to fully disperse the green CdSe/ZnS quantum dots and red CdSe/ZnS quantum dots. The resulting mixture is then mixed with an oxime-based silicone at a weight ratio of 2:8 to form a final mixture. The final mixture is dispensed onto a bare LED (emission peak at 450-460 nm) and is cured at 70° C. for 3 hours. The LED output spectrum was shown in FIG. 4. As shown in FIG. 4, quantum dots showed good emission intensity, because the quantum dots were homogeneously dispersed in the cured composite material without aggregation. Using quantum dots to convert part of the blue light into green and red colors allow LEDs to produce better quality of white light (i.e. red, green, and blue lights combined) that covers a wider color space than the color space covered using traditional yellow phosphors and thus producing wider color gamut.

Example 5

Figure 5:
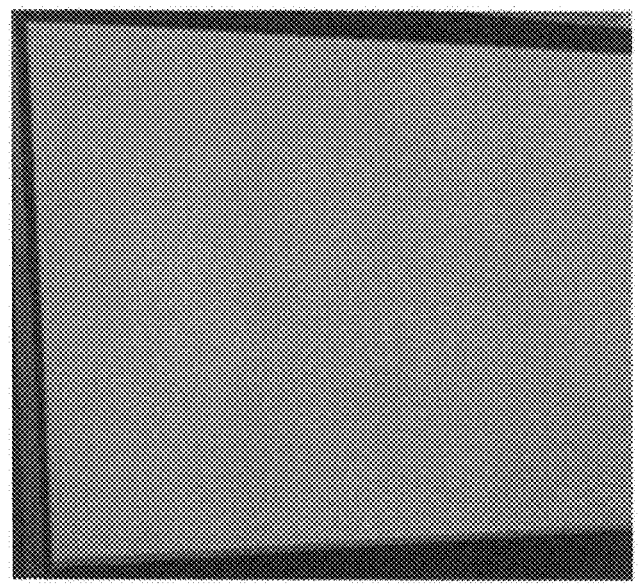
FIG. 5 is a green test screen from a digital light processing (DLP) projector of Example 5.
Figure 6:
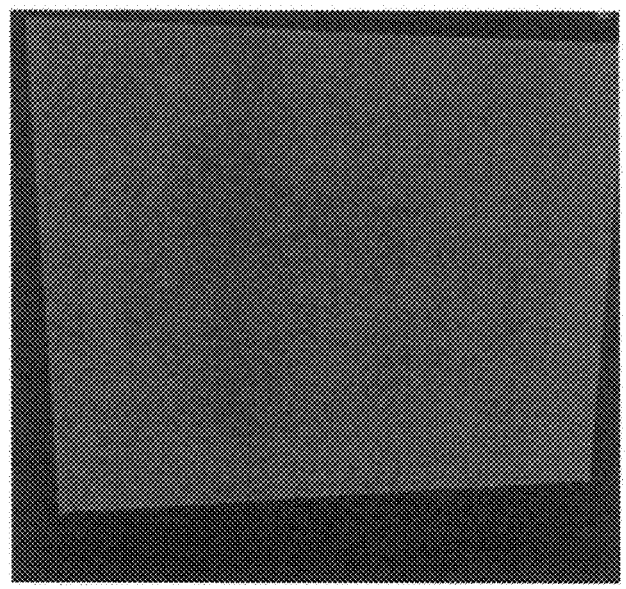
FIG. 6 is a red test screen from a digital light processing (DLP) projector of Example 5.

Amodimethicone (available from Dow Corning Corp.) and green CdSe/ZnS quantum dots (which particle size ranges from 1 nm to 20 nm; synthesized according to scientific literatures) are mixed at a weight ratio of 9:1 to form a first mixture. The first mixture is sonicated at room temperature (e.g., 25° C.) to fully disperse the green quantum dots. The first mixture is then mixed with an oxime-based silicone at a weight ratio of 2.5:7.5 and applied onto a color-conversion section of a projector color wheel. A separate mixture (hereafter called a second mixture) with red CdSe/ZnS quantum dots (which particle size ranges from 1 nm to 20 nm; synthesized according to scientific literatures) instead of the first mixture is also prepared using the same method and applied onto a different section of same projector color wheel. The first and second mixtures are cured at 70° C. for 3 hours before installing the color wheel into a digital light processing (DLP) projector to produce green and red test screens (as shown in FIGS. 5 and 6). As shown in FIGS. 5 and 6, the green and red test screens were successfully produced using quantum dots as light converters. Using quantum dots to produce green and red colors allow projectors to cover a wider color space than the color space covered using traditional yellow phosphors and thus producing wider color gamut.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A composite material comprising:
 a plurality of quantum dots; and
 a matrix formed by a plurality of siloxane compounds crosslinked with a component which comprises a plu- rality of oxime-based silicone primer compounds, wherein the quantum dots are chemically bonded to the matrix through a plurality of amino groups of the siloxane compounds, and the quantum dots are uniformly dispersed in the matrix of the composite material.

2. The composite material according to claim 1, wherein one portion of a surface of one of the quantum dots is covered by the matrix with the amino groups.

3. The composite material according to claim 2, wherein another portion of the surface of one of the quantum dots is surrounded by the matrix without the amino groups.

4. The composite material according to claim 1, wherein the quantum dots comprise core structure, core-shell structure, core-multishell structure, core-alloy layer-shell structure, core-alloy layer-multishell structure, core-gradient alloy-shell structure, or a combination thereof.

5. The composite material according to claim 1, wherein each of the quantum dots comprise a core structure and a shell structure covering the core structure,
the core structure is selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe, and alloys thereof, and
the shell structure is selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe, and alloys thereof.

6. The composite material according to claim 1, wherein the quantum dots are perovskite quantum dots.

7. The composite material according to claim 1, wherein the siloxane compounds are represented by formula I:

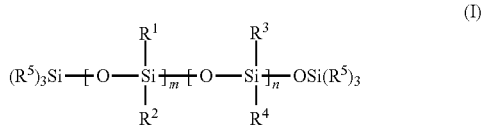
(I)

wherein each $R^1$, $R^2$, $R^3$, $R^4$ and $R^5$ is independently selected from the group consisting of $C_{1-8}$ alkyl, cycloalkyl, aryl, alkoxy and $C_{2-8}$ alkylamine, and at least one of $R^1$-$R^5$ is $C_{2-8}$ alkylamine;

m is an integer from 1 to 500; and
n is an integer from 0 to 500.

8. A light emitting diode (LED) device comprising:
a LED chip; and
the composite material according to claim 1 disposed onto the LED chip.

9. A projector color wheel comprising:
a plurality of color-conversion sections; and
the composite material according to claim 1 disposed onto at least one of the color-conversion sections.

10. A method of manufacturing a composite material comprising:
mixing a plurality of quantum dots and a plurality of siloxane compounds to form a first mixture, wherein each of the siloxane compounds has a plurality of amino groups, and the siloxane compounds are chemically bonded to at least one of the quantum dots through the amino groups; and
adding a second component comprising a plurality of oxime-based silicone primer compounds to the first mixture, and then performing a curing step so as to form a matrix of the composite material, wherein the quantum dots are uniformly dispersed in the matrix of the composite material.

11. The method according to claim 10, wherein a process of the oxime-based silicone primer compounds respectively crosslinked with the siloxane compounds during the curing step comprises a moisture activation step followed by a condensation reaction step.

12. The method according to claim 10, wherein the first mixture and the second component are substantially solvent-free, and no solvent removal step is required.

13. The method according to claim 10, wherein the first mixture and the second component are substantially Pt catalyst-free or Rh catalyst-free.

14. The method according to claim 10, wherein a content of the quantum dots is 0.1-20 wt % and a content of the siloxane compounds is 80-99.9 wt % based on the total weight of the first mixture.

15. The method according to claim 10, wherein a content of the second component is equal to or more than a content of the first mixture.

16. The method according to claim 10, wherein a weight ratio of the first mixture to the second component ranges from 1:9 to 1:1.

* * * * *